MODULATION CIRCUIT

Filed Nov. 13, 1945

Inventor

BERNARD SALZBERG

By Ralph L. Chappell

Attorney

Patented Jan. 9, 1951 2,537,092

UNITED STATES PATENT OFFICE 2,537,092

MODULATION CIRCUIT

Bernard Salzberg, Washington, D. C.

Application November 13, 1945, Serial No. 628,335

13 Claims. (Cl. 332—40)

Figure 1:
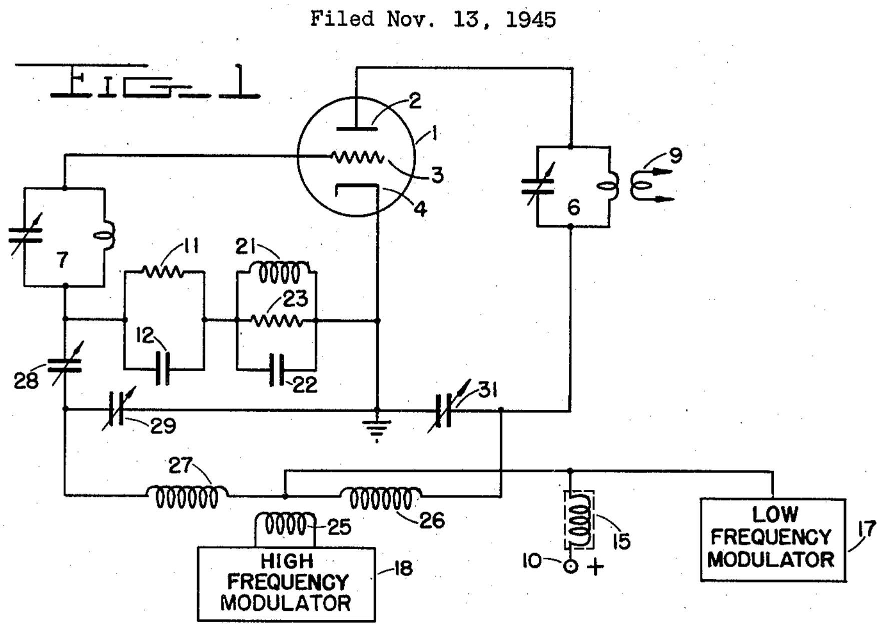

(Granted under the act of March 3, 1883, as amended April 30, 1928; 370 O. G. 757)

This invention relates to the modulation of radio frequency voltages, and is particularly directed to the problem of modulating a very high frequency voltage wave with another voltage of frequency which, while lower than the carrier frequency, lies within the band of high frequencies commonly employed as carrier frequencies in radio transmission circuits.

The invention also comprehends the modulation of a very high frequency carrier with modulating frequencies extending from low audio voltages up to relatively high frequencies such as are used in radio communication.

The invention further comprehends the modulation of a very high frequency carrier with a band of high modulation frequencies such as would represent a portion of the spectrum normally used for radio transmission.

In numerous applications it is necessary to modulate carrier frequency voltages with modulating frequencies extending into the relatively high radio frequency band. For high quality television broadcasting, for instance, modulation components up to a frequency of 10 or 15 megacycles may be required in the composite signal to be radiated. In other applications it may be desirable to employ modulating frequencies as high as 30 megacycles.

Known methods of effecting modulation have been found inoperative when high frequencies such as the latter mentioned figure are used. At conventional low modulating frequencies, such as those which make up a speech wave, plate modulation of an oscillator or amplifier may be satisfactorily effected. With higher frequencies, however, attempts to obtain a substantial percentage modulation by conventional arrangements renders the conventional oscillator or amplifier circuit inoperative. The present invention provides means for effecting high frequency modulation.

It is accordingly an object of the invention to modulate a carrier with a very high frequency wave.

It is another object of the invention to modulate a carrier with a plurality of components including audio frequency voltages and high radio frequency voltages.

Another object of the invention is to provide a modulated oscillator for generating a carrier modulated with very high frequency voltage.

A further object of the invention is to provide a modulated amplifier which will be effective when very high frequency modulating voltages are applied.

Figures 2, 3:
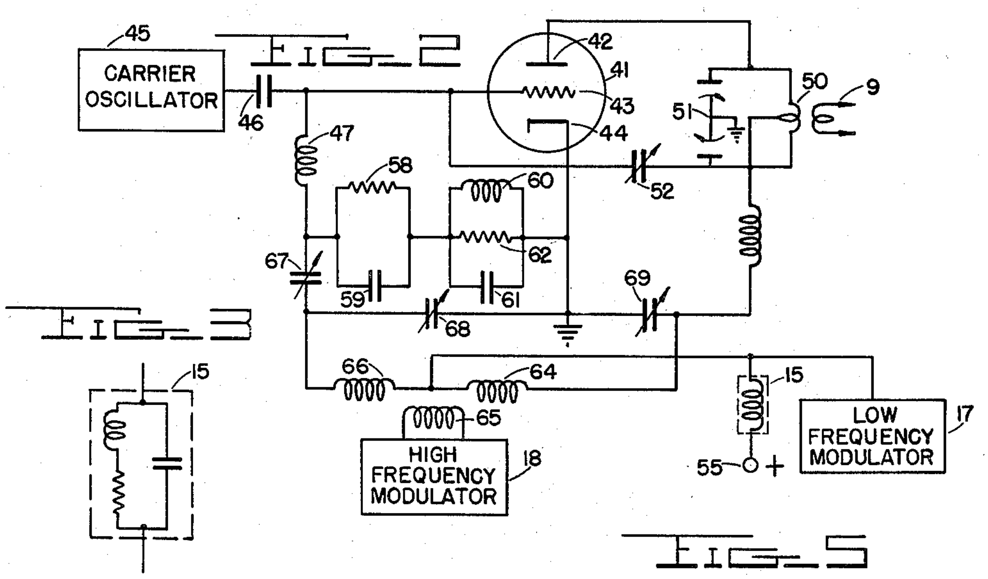

Whereas the invention is generally applicable to plate modulation of such vacuum tube circuits as common-grid, common-plate or common-cathode oscillators and amplifiers for the purposes of illustration it will be described in connection with the two exemplary embodiments shown in the drawings, in which:

Fig. 1 discloses a modulated oscillator of the common-cathode type,

Fig. 2 discloses a modulated amplifier of the common-cathode type, and

Figure 5:
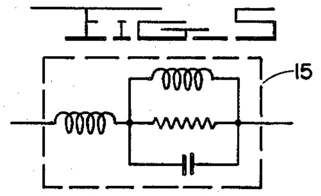
Figure 4:
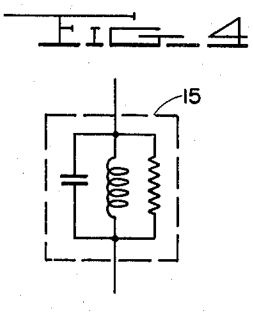

Figs. 3, 4 and 5 show networks suitable for use in the circuits of Figs. 1 and 2.

The circuit of Fig. 1 comprises a modulated oscillator of the common-cathode type. This consists of a vacuum tube 1, shown as a triode. The triode is provided with anode 2, control grid 3, and cathode 4. Cathode 4 may be indirectly heated, and the heating element is not shown in the figure.

The triode is connected in an oscillating circuit which comprises a plate tank circuit 6 and a grid tank circuit 7. Oscillation is effected through the distributed grid-anode capacitance within tube 1. Power output for radiation or otherwise may be taken from coupling loop 9.

In the specific oscillating circuit shown, anode 2 is energized in series through tuned circuit 6 from a positive source of potential 10. Cathode 4 is directly returned to ground. Grid 3 is returned to ground through biasing resistor 11 bypassed with capacitor 12, which presents low impedance to the carrier and to the high modulating frequencies.

The circuit components described are effective in producing oscillation at the carrier frequency. In order to effect low frequency modulation, an impedance 15, across which the modulating potential may be developed, is connected between the source of positive potential 10 and the plate tank circuit 6.

A simple inductance as shown would be ineffective at very high modulating frequencies because of its distributed capacitance. If it is desired to modulate with a band of frequencies from low audio to relatively high radio frequencies, a video type circuit may be employed as shown in Fig. 3.

If it is desired to modulate with a relatively narrow band of radio frequencies, the circuit of Fig. 4 may be used. An arrangement for audio and a band of radio modulating frequencies is shown in Fig. 5.

In the circuit shown two sources of modulating potential are included. A low frequency modulator 17 is provided, feeding the anode circuit of the oscillator by voltages developed across the anode impedance 15.

High frequency modulation is effected by transformer coupling of modulator 18 into the anode circuit. For this purpose transformer primary 25 is energized by the high frequency modulator and this winding is coupled to secondary 26 in series with the anode circuit. Secondary 26 may be resonated at the high modulating frequencies by capacitor 31.

With the conventional components thus far described, it is impossible to effect any substantial amount of modulation from the high frequency modulator 18 even though tank circuits 6 and 7 are deliberately broadened in frequency response to prevent sideband frequency trimming. This is due to the fact that at substantial modulation percentages stable oscillator operation requires proper grid bias variation during the modulation frequency cycle. This cannot take place in conventional circuits due to the fact that the series grid resistor 11 is shunted by a capacitor 12 which constitutes an effective bypass to the high modulating frequency components of the grid current. In order, therefore, to permit the application of a modulating frequency voltage component to the control grid 3 for maintaining proper bias during the modulating frequency cycle, a series component offering substantial impedance to the modulating frequency is provided in the grid return circuit. In the embodiment shown this component comprises a network selectively responsive to different frequencies, and adjusted to offer substantial impedance to the high modulating frequency, while being highly conductive to the carrier component. This network will therefore permit the development of a substantial modulating frequency voltage component of the control grid resulting from the electron flow to the grid.

In the specific embodiment shown, the impedance network is anti-resonant to the high modulating frequencies. The network comprises an inductance 21 in parallel with a capacity 22, the combination being tuned to the high modulating frequency. In order to limit the impedance offered to the high modulating frequency, the anti-resonant network is damped by resistor 23 which may be conveniently adjusted to effect optimum operating conditions, and thus broadening the frequency band in which the network is effective.

It has been further determined, however, that with vacuum tubes where a substantial grid-anode capacitance exists, as in the triode shown, the grid-anode reactance at high modulating frequencies is sufficiently low so that current of modulating frequency flows through the anode-to-grid capacitance and through the network 21, 22, 23, to ground. Such flow of modulating frequency current through this path builds up a modulating voltage across the network formed by elements 21, 22, 23 which is opposite in phase to that developed by flow of electron grid current through the tube, resulting in improper operation.

In accordance with the above-stated objects, the invention provides means for overcoming the grid-cathode modulation voltage variation resulting from this grid-anode capacitance and permits high percentage modulation of the carrier frequency signal. This is accomplished by injecting in the grid-cathode circuit a voltage of the proper phase and amplitude at the high modulating frequencies to overcome the capacitive drive on the grid from the anode and thus to permit the normal grid current variation to take effect progressively during the modulation cycle to maintain proper operating bias conditions.

In the embodiment shown, the injected voltage is developed in the grid return circuit between grid and ground. For this purpose, a second secondary 27 is coupled to the primary 25 energized from the high frequency modulator, and its output voltage is applied through adjustable capacitor 28 to the grid return circuit between tuned tank 7 and the resistance-capacitance grid bias network. Capacitor 29 is connected between capacitor 28 and ground across secondary 27, and with capacitor 31 balances the transformer secondaries.

Upon proper adjustment of capacitor 28 the amplitude of the inverse voltage applied to the grid may be corrected to cancel the grid drive through the grid-anode capacitance and thereby allow proper operation of the oscillator.

The modulation network shown is further advantageous in that it will maintain capacitative balance over a very wide band of frequency to be supplied by the high frequency modulator.

In a specific embodiment of the circuit shown in Fig. 1, the carrier frequency was 700 megacycles per second, the high modulating frequency was 30 megacycles per second, and the low frequency modulation supplied communication signals in the audio range.

The embodiment of the invention shown in Fig. 2 illustrates its application to a modulated amplifier of the neutralized common-cathode type. The circuit includes a triode 41 having anode 42, grid 43 and indirectly heated cathode 44. Excitation is obtained from a source of carrier frequency voltage, shown as a carrier oscillator 45. In the example, the carrier oscillator is coupled to the grid through capacitor 46 and the grid drive is developed across a carrier frequency choke 47 connected in series in the grid return.

The plate tank circuit includes inductance 50 and balanced capacitor 51. Grid-plate neutralization is obtained at carrier frequency through an adjustable capacitor 52, connected between the grid and the tank circuit.

In this circuit the anode potential is supplied from source 55 and is fed through series impedance 15. The latter offers substantial impedance to the modulating frequencies, and may have as broad a frequency response as necessary. The impedance shown in an inductance, but broadly responsive networks, such as R-L-C group 60, 61, 62 may be used.

As in Fig. 1, high frequency modulating components are supplied by modulator 18, and low frequency modulation is supplied from modulator 17.

The grid return circuit includes grid resistor 58 shunted by a capacitor 59 acting as a by-pass to the carrier frequency and also to the high frequency modulation. As in Fig. 1, a series component offering substantial impedance to the high modulation frequency is provided. This comprises the network including inductance 60, capacitor 61 and resistance 62. This network is broadly anti-resonant at the high modulating frequencies and permits development of voltage components of high modulation frequencies on the grid.

The operation of the circuit is similar to that of Fig. 1, and permits development of the proper grid bias during the modulating voltage cycle.

As in Fig. 1, means are provided for injecting in the grid cathode circuit a voltage overcoming the grid drive which is effected through the grid-anode capacitance. The modulation voltage is applied to the anode circuit through secondary 64 which is coupled with primary 65 energized from the high frequency modulator 18. The voltage of the modulation frequency but in inverse phase to that developed in the anode circuit is obtained from secondary 66 which is also coupled with primary 65. This inverse voltage of the proper amplitude is introduced into the grid circuit through variable capacitor 67 as shown in Fig. 2. Capacitor 68 is connected across secondary 66 between capacitor 67 and ground. As in the case of the modulated oscillator shown in Fig. 1, this network is balanced over a wide frequency band which may be supplied by the high frequency modulator 18.

It will be understood that the embodiments of the invention described above are exemplary only and that the scope thereof will be determined from the appended claims.

The invention described herein may be manufactured and used by or for the Government of the United States of America for governmental purposes without the payment of any royalties thereon or therefor.

What is claimed is:

1. A modulation circuit comprising a vacuum tube having a control grid, an anode, said electrodes having distributed capacitance therebetween, and a cathode, means for applying a carrier frequency voltage between the control grid and cathode, a source of high frequency modulating voltage, means for coupling said high frequency voltage to the plate to establish a plate modulating signal being operative to apply a high modulation frequency current drive on the grid through said distributed capacitance, means responsive to the high frequency modulating voltage source for supplying a modulating signal of phase inverse to the plate signal, and means for coupling said inverse signal to the grid to counteract the drive through the grid-anode capacitance.

2. A modulated oscillator comprising a vacuum tube having a control grid, an anode, said electrodes having distributed capacitance therebetween, and a cathode, circuit means connecting with the grid and anode to establish oscillation, a source of high frequency modulating voltage, means for coupling said high frequency voltage to the plate to establish a plate modulating signal, said plate modulating signal being operative to apply a high modulation frequency current drive on the grid through said distributed capacitance, means responsive to the high frequency modulating voltage source for supplying a modulating signal of phase inverse to the plate signal, and means for coupling said inverse signal to the grid to counteract the drive through the grid-anode capacitance.

3. A modulated amplifier comprising a vacuum tube having a control grid, an anode, said electrodes having distributed capacitance therebetween, and a cathode, means for applying a carrier frequency voltage between the control grid and cathode, a source of high frequency modulating voltage, means for coupling said high frequency voltage to the plate to establish a plate modulating signal, said plate modulating signal being operative to apply a high modulation frequency current drive on the grid through said distributed capacitance, means responsive to the high frequency modulating voltage source for supplying a modulating signal of phase inverse to the plate signal, and means for coupling said inverse signal to the grid to counteract the drive through the grid-anode capacitance.

4. A modulation circuit comprising a vacuum tube having a control grid, an anode, said electrodes having distributed capacitance therebetween, and a cathode, means for applying a carrier frequency voltage to the control grid, modulating means for applying an andio frequency modulation voltage to the anode, a source of high frequency modulating voltage, means for coupling said high frequency voltage to the plate to establish a plate modulating signal, said plate modulating signal being operative to apply a high modulation frequency current drive on the grid through said distributed capacitance, means responsive to the high frequency modulating voltage source for supplying a modulating signal of phase inverse to the plate signal, and means for coupling said inverse signal to the grid to counteract the drive through the grid-anode capacitance.

5. A modulated oscillator comprising a vacuum tube having a control grid, an anode, said electrodes having distributed capacitance therebetween, and a cathode, circuit means connected with the grid and anode to establish oscillation, modulating means for applying an audio frequency modulation voltage to the anode, a source of high frequency modulating voltage, means for coupling said high frequency voltage to the plate to establish a plate modulating signal, said plate modulating signal being operative to apply a high modulation frequency current drive on the grid through said distributed capacitance, and means for coupling said inverse signal to the grid to counteract the drive through the grid-anode capacitance.

6. A modulated amplifier comprising a vacuum tube having a control grid, an anode, said electrodes having distributed capacitance therebetween, and a cathode, modulating means for applying a carrier frequency voltage between the control grid and cathode, a source of high frequency modulating voltage, means for coupling said high frequency voltage to the plate to etablish a plate modulating signal, said plate modulating signal voltage being operative to apply a high modulation frequency current drive on the grid through said distributed capacitance, means responsive to the high frequency modulating voltage source for supplying a modulating signal of phase inverse to the plate signal, and means for coupling said inverse signal to the grid to counteract the drive through the grid-anode capacitance.

7. A modulation circuit comprising a vacuum tube having a control grid, an anode, said electrodes having distributed capacitance therebetween, and a cathode, means for applying a carrier frequency voltage between the control grid and cathode, a source of high frequency modulating voltage, means for coupling said high frequency voltage to the plate to establish a plate modulating signal, said plate modulating signal being operative to apply a high modulation frequency current drive on the grid through said distributed capacitance, a grid return circuit presenting a high impedance to the high modulating frequencies, means responsive to the high frequency modulating voltage source for supplying a modulating signal of phase inverse to the plate signal, and means for coupling said inverse signal to the grid to counteract the drive through the grid-anode capacitance.

8. A modulated oscillator comprising a vacuum tube having a control grid, an anode, said electrodes having distributed capacitance therebetween, and a cathode, circuit means connecting with the grid and anode to establish oscillation, a source of high frequency modulating voltage, means for coupling said high frequency voltage to the plate to establish a plate modulating signal, said plate modulating signal being operative to apply a high modulation frequency current drive on the grid through said distributed capacitance, a grid return circuit presenting a high impedance to the high modulating frequencies, means responsive to the high frequency modulating voltage source for supplying a modulating signal of phase inverse to the plate signal, and means for coupling said inverse signal to the grid to counteract the drive through the grid-anode capacitance.

9. A modulated amplifier comprising a vacuum tube having a control grid, an anode, said electrodes having distributed capacitance therebetween, and a cathode, means for applying a carrier frequency voltage between the control grid and cathode, a source of high frequency modulating voltage, means for coupling said high frequency voltage to the plate to establish a plate modulating signal, said plate modulating signal being operative to apply a high modulation frequency current drive on the grid through said distributed capacitance, a grid return circuit presenting a high impedance to the high modulating frequencies, means responsive to the high frequency modulating voltage source for supplying a modulating signal of phase inverse to the plate signal, and means for coupling said inverse signal to the grid to counteract the drive through the grid-anode capacitance.

10. A modulation circuit comprising a vacuum tube having a control grid, an anode, said electrodes having distributed capacitance therebetween, and a cathode, means for applying a carrier frequency voltage between the control grid and cathode, modulating means for applying an audio frequency modulation voltage to the anode, a source of high frequency modulating voltage, means for coupling said high frequency voltage to the plate to establish a plate modulating signal, said plate modulating signal being operative to apply a high modulation frequency current drive on the grid through said distributed capacitance, a grid return circuit presenting a high impedance to the high modulating frequencies, means responsive to the high frequency modulating voltage source for supplying a modulating signal of phase inverse to the plate signal, and means for coupling said inverse signal to the grid to counteract the drive through the grid-anode capacitance.

11. A modulated oscillator comprising a vacuum tube having a control grid, an anode, said electrodes having distributed capacitance therebetween, and a cathode, modulating means for applying an audio frequency modulation voltage to the anode, a source of high frequency modulating voltage, means for coupling said high frequency voltage to the plate to establish a plate modulating signal, said plate modulating signal being operative to apply current of high modulation frequencies on the grid through said distributed capacitance, a grid return presenting a high impedance to the high modulating frequencies, means responsive to the high frequency modulating voltage source for supplying a modulating signal of phase inverse to the plate signal, and means for coupling said inverse signal to the grid to counteract the drive through the grid-anode capacitance.

12. A modulated amplifier comprising a vacuum tube having a control grid, an anode, said electrodes having distributed capacitance therebetween, and a cathode, means for applying a carrier frequency voltage to the control grid, modulation means for applying an audio frequency modulation voltage to the anode, a source of high frequency modulating voltage, means for coupling said high frequency voltage to the plate to establish a plate modulating signal, said plate modulating signal being operative to apply a high modulation frequency current drive on the grid through said distributed capacitance, a grid return circuit presenting a high impedance to the high modulating frequency, means responsive to the high frequency modulating voltage source for supply a modulating signal of phase inverse to the plate signal, and means for coupling said inverse signal to the grid to counteract the drive through the grid-anode capacitance.

13. A modulation circuit comprising a vacuum tube having a control grid, an anode, said electrodes having distributed capacitance therebetween, and a cathode, means for applying a carrier frequency voltage between the control grid and cathode, a source of high frequency modulating voltage, means for coupling said high frequency voltage to the plate to establish a plate modulating signal, said plate modulating signal being operative to apply a high modulation frequency current drive on the grid through said distributed capacitance, means responsive to the high frequency modulating voltage source for supplying a modulating signal of phase inverse to the plate signal, and capacitive means for coupling said inverse signal to counteract the drive through the grid-anode capacitance.

BERNARD SALZBERG.

REFERENCES CITED

The following references are of record in the file of this patent:

UNITED STATES PATENTS

| Number | Name | Date |
|---|---|---|
| 2,003,285 | Ditcham | June 4, 1935 |

FOREIGN PATENTS

| Number | Country | Date |
|---|---|---|
| 435,302 | Great Britain | Sept. 18, 1935 |